United States Patent [19]
Iino et al.

[11] Patent Number: 5,412,329
[45] Date of Patent: May 2, 1995

[54] PROBE CARD

[75] Inventors: Shinji Iino, Yamanashi; Tamio Kubota, Kofu; Keiichi Yokota, Nirasaki, all of Japan

[73] Assignee: Tokyo Electron Yamanashi Limited, Nirasaki, Japan

[21] Appl. No.: 280,567

[22] Filed: Jul. 26, 1994

Related U.S. Application Data

[63] Continuation of Ser. No. 978,389, Nov. 18, 1992, abandoned.

[30] Foreign Application Priority Data

Nov. 18, 1991 [JP] Japan ................................. 3-301961

[51] Int. Cl.⁶ .............................................. G01R 1/06
[52] U.S. Cl. ...................................................... 324/754
[58] Field of Search ................ 324/754, 72.5, 756; 439/482, 483

[56] References Cited

U.S. PATENT DOCUMENTS

| | | | |
|---|---|---|---|
| 4,906,920 | 3/1990 | Huff et al. | 324/158 F |
| 5,134,365 | 7/1992 | Okubo et al. | 324/158 F |
| 5,180,977 | 1/1993 | Huff | 324/158 F |

FOREIGN PATENT DOCUMENTS

| | | |
|---|---|---|
| 59-9934 | 1/1984 | Japan . |
| 62-173733 | 7/1987 | Japan . |
| 2210846 | 8/1990 | Japan . |

*Primary Examiner*—Vinh Nguyen
*Attorney, Agent, or Firm*—Oblon, Spivak, McClelland, Maier, & Neustadt

[57] ABSTRACT

A probe card used in a probing test machine which send and receive test signals into circuits through pads of a semiconductor chip, thereby examining the electrical characteristics of the circuits. The probe card comprises a supporting plate, a flexible printed circuit base including a flexible film base material supported by the supporting plate, circuits printed on the film base material being connected electrically to a tester, contactors connected electrically to the printed circuits and adapted to be brought into contact with the pads in equally corresponding relation, and a cushioning medium designed so as to back up a section in which the contactors are mounted. When the contactors are brought into contact with the pads, individually, the cushioning medium undergoes an elastic deformation, so that the contact between the contactors and the pads is improved.

12 Claims, 10 Drawing Sheets

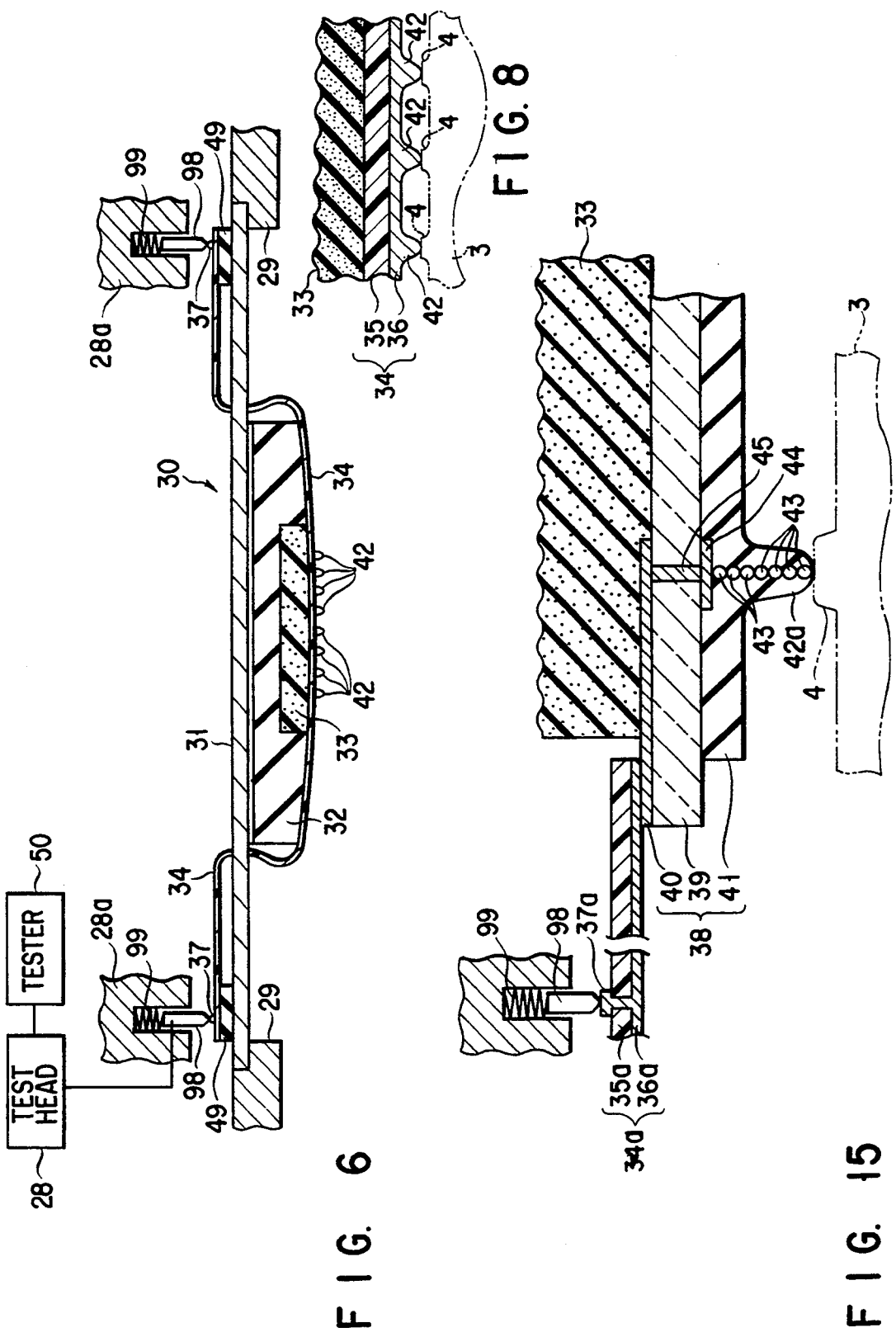

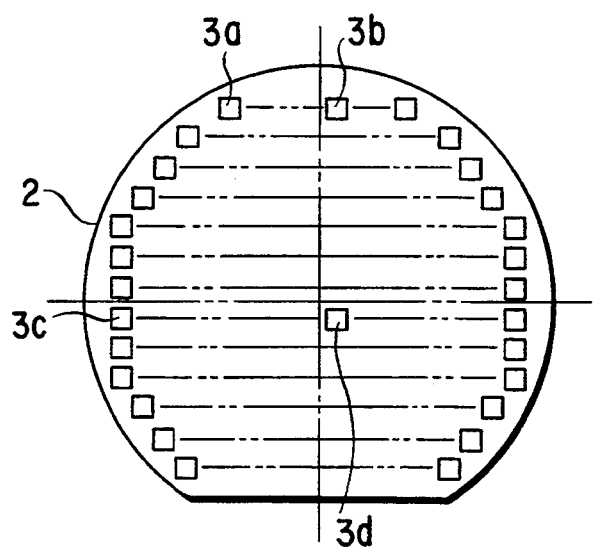
F I G. 13
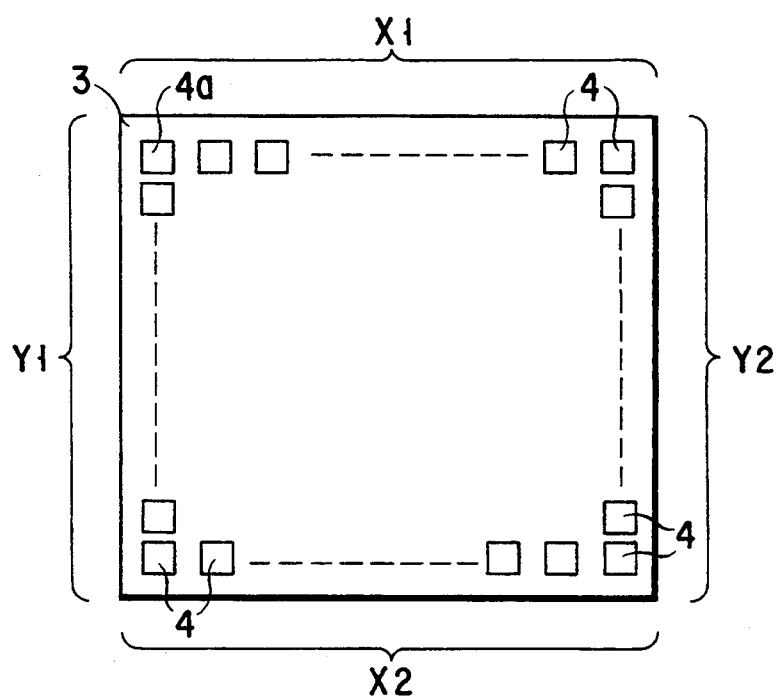
F I G. 14

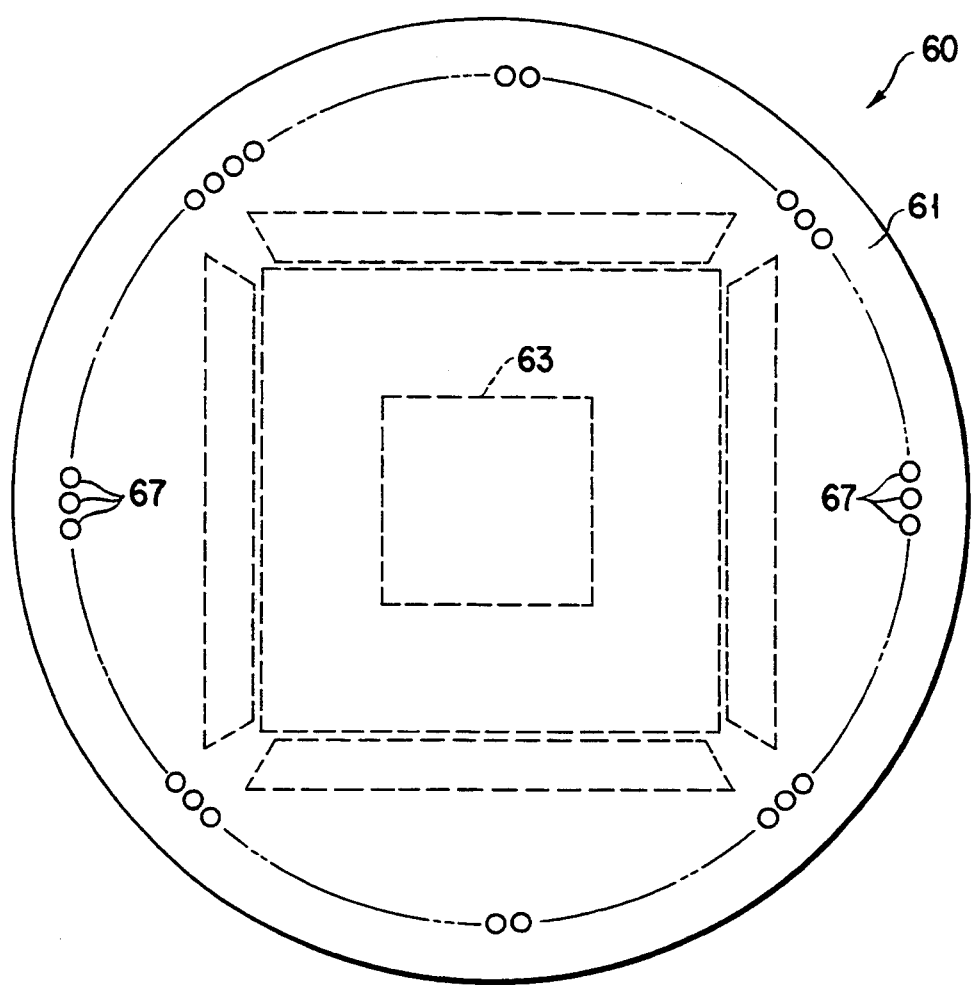
F I G. 17A
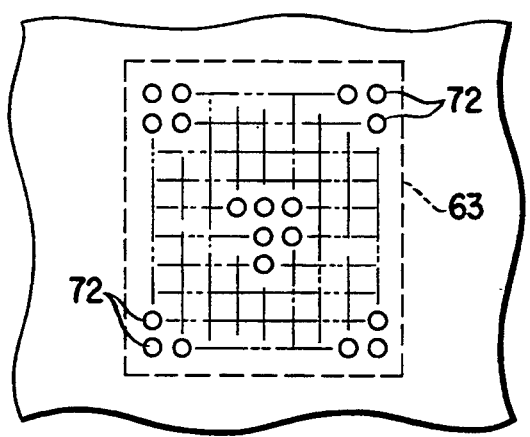
F I G. 17B

PROBE CARD

This application is a continuation of application Ser. No. 07/978,389, filed on Nov. 18, 1992, now abandoned.

BACKGROUND OF THE INVENTION

1. Field of the Invention

The present invention relates to a probe card used to test the conduction of semiconductor chip circuits and LCD circuits.

2. Description of the Related Art

In the processes of manufacturing semiconductor devices or LCD glass bases (hereinafter referred to as LCD bases), a probing test is conducted in order to check circuits for disconnection or electrical characteristics. For example, a probing test machine (hereinafter referred to as a prober) is used in a probing test on semiconductor chip circuits. The prober comprises a loading/unloading section and a test section. The loading/unloading section is provided with a prealignment stage. The test section is provided with a wafer stage, and a probe card.

As shown in FIG. 1, the conventional probe card 6 is fitted with a number of probes 7 which are made of tungsten or Au—Cu alloy. The probe card 6 is fixed the frame of the prober, and the wafer stage 5 is located right under the card. A chip 3 is observed through apertures 6a of the probe card by means of an optical position sensor, such as a microscope 8 or CCD camera (not shown), and each pad 4 is aligned with the distal end of its corresponding probe 7, as shown in FIG. 2. This aligning operated is referred to as teaching. Based on the teaching, the stage 5 is moved in the X, Y, Z, and 8 directions, so that each pad 4 is brought into the distal end of its corresponding probe 7, as shown in FIG. 3. Electric current is supplied to the circuit through the probes 7, and signals from the circuit are delivered to the tester. Based on the test signals, the tester discriminates the conformity of the IC chip.

Modern semiconductor devices have a tendency toward higher-integration versions, such as 16- and 64-megabit versions, so that the pads 4 in each chip are as many as several hundreds. Each of pads 4 has a square top surface with each side of 60 to 100 $\mu$m. Accordingly, the pads are arranged close to one another, that is, the pitches between the pads are extremely short. The pitch is distance of 100 to 200 $\mu$m. Thus, the probes 7 to be attached to the probe card 6 must be considerably increased in number, e.g. several hundred, so that the layout of the probes is very difficult.

In large-scale integrated circuits, such as VLSIs and ULSIs, or Gate-Array formed by converting standard cells into composite chips, the pads 4 are arranged in the central region of the chip 3 as well as the peripheral regions thereof. Therefore, the VLSI, ULSI, and composite-chip ICs cannot be tested by means of the probe card 6 of the conventional type. This results because the array of the probes 7 is laid out so that the probes cannot be in contact with those pads 4a in the central region of the chip, although they can be in contact with the pads 4 in the peripheral region of the chip.

In some conventional probe cards, probes are arranged doubly on an insulating substrate in order to effect a probing test on the VLSI and the like. In these double-type probe cards, however, hundreds of probes having the end diameter of about 60 & L m must be mounted on the substrate, so that the mounting accuracy is critical. Also, the manufacture of the probe cards of this type requires manual operations, thus entailing high costs.

Meanwhile, it is necessary to ensure reliable electrical contact with the pads of semiconductor chips or LCD bases. For example, the wafer stage 5 is over-driven in the Z direction to press the pads 4 against the probes 7 so that the respective distal ends of the probes 7 bite in some measure into an oxide film of the upper surfaces of the pads 4, individually. In the high-integration chips, such as the VLSIs, however, there are differences in level or indentations between the pads, and the conventional metallic probes cannot cope with these indentations. More specifically, the probes bite too deep into high-profile pads, and cannot enjoy satisfactory contact with low-profile pads. Thus, the conventional probe cards cannot execute a reliable probing test.

According to the conventional probe cards, moreover, only one chip can be handled in each cycle of the probing test. Therefore, it takes a lot of time to test a wafer having a hundred chips or more.

On the other hand, each LCD base, which is larger than each semiconductor chip, cannot be tested at a time by means of the conventional probe card. Therefore, the probe card is moved to test the LCD at several portions. In this case, the pads on the LCD base and the probes must be aligned when the probe card is moved to each portion of the LCD. Obviously, examination of an LCD base requires a long time. Since the LCD bases recently developed have increased sizes, (e.g., 450×450 mm) it takes a very long time to accomplish a probing test on them. It is therefore demanded that an inexpensive probe card be provided which can have its contactors held in stable and uniform contact with the pads of a LCD base, respectively.

SUMMARY OF THE INVENTION

An object of the present invention is to provide a probe card capable of securely conducting probing tests on VLSI chips, ULSIs, composite-chip ICs, and LCD bases.

Another object of the invention is to provide a probe card in which contactors and pads can be easily aligned with one another, and which can be simultaneously contacted to pads, and which can accomplish a test in a short time.

Still another object of the invention is to provide a probe card which can be manufactured and maintained with ease.

According to an aspect of the present invention, there is provided a probe card which comprises a supporting plate, a circuit base supported by the supporting plate and including circuits connected electrically to test signal supply means, contactors connected electrically to the circuits of the circuit base and adapted to be brought into contact with pads of an object of testing in equally corresponding relation, and an elastic member designed so as to back up a section in which the contactors are mounted.

when the contactors and the pads are brought into contact with one another, the elastic member undergoes an elastic deformation, so that the contact between the contactors and the pads is improved. Even if there are differences in level between the pads, in particular, all the contactors can enjoy satisfactory contact with their corresponding pads, following the respective to-be-contacted surfaces of the pads, individually.

Preferably, each of the contactors includes an elastic protuberance and metal spheres embedded therein. Silicone rubber, fluoroplastics, polyethylene, etc. may be used as the material of the protuberances. Each metal sphere is preferably formed by gilding or silvering a nickel or iron sphere.

To accomplish high-speed test on VLSIs and ULSIs, it is desirable that the circuit connected between the contactor contacts, on the one hand, and the PO GO-pin contacts have no contacts and thus have a low impedance.

Preferably, furthermore, the supporting plate is penetrated by a through hole through which the pads or alignment marks can be observed.

Also, the contactors are preferably arranged over the central portion of a region to be tested as well as over the peripheral edge portion thereof. Thus, devices such as composite-chip ICs can undergo a probing test.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a vertical sectional view showing a probe card according to a first embodiment of the present invention;

FIG. 8 is an enlarged vertical sectional view showing part of the probe card of the first embodiment;

FIG. 13 is a diagram showing a patterning surface of a semiconductor wafer;

FIG. 14 is an enlarged view showing one semiconductor chip;

FIG. 15 is an enlarged vertical sectional view showing part of the probe card of the second embodiment;

FIG. 17A is a top plan view of the probe card of the third embodiment;

FIG. 17B is a partial bottom plan view showing the central portion (attached contactor portion) of the probe card of the third embodiment;

DETAILED DESCRIPTION OF THE PREFERRED EMBODIMENTS

Various embodiments of the present invention will now be described in detail with reference to the accompanying drawings.

Figure 1:
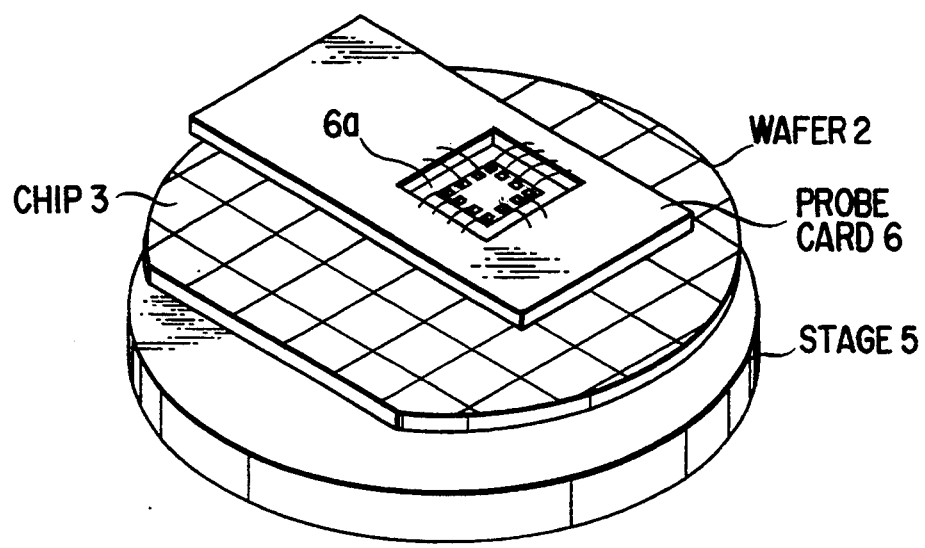
FIG. 1 is a perspective view showing an outline of a conventional probe card.
Figure 2:
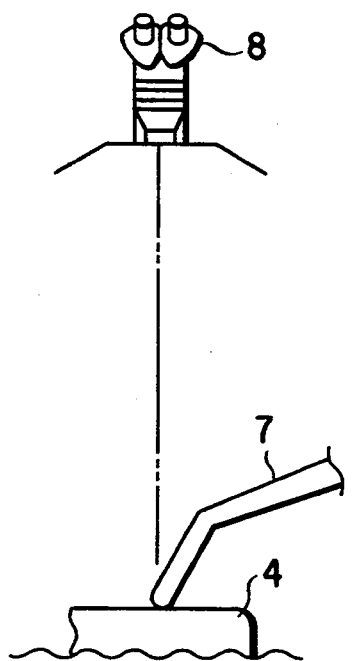
FIG. 2 is a partial enlarged view schematically showing a contact portion between a conventional probe and pad.
Figure 3:
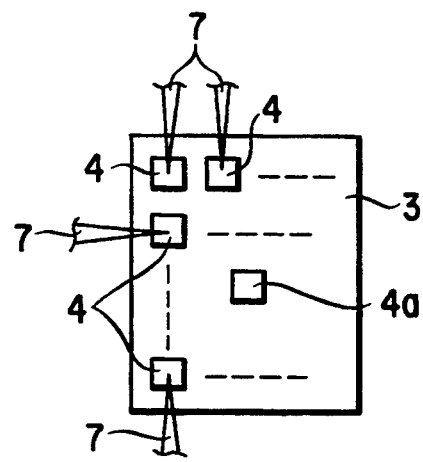
FIG. 3 is an enlarged plan view schematically showing the relationships between conventional probes and pads.
Figure 4:
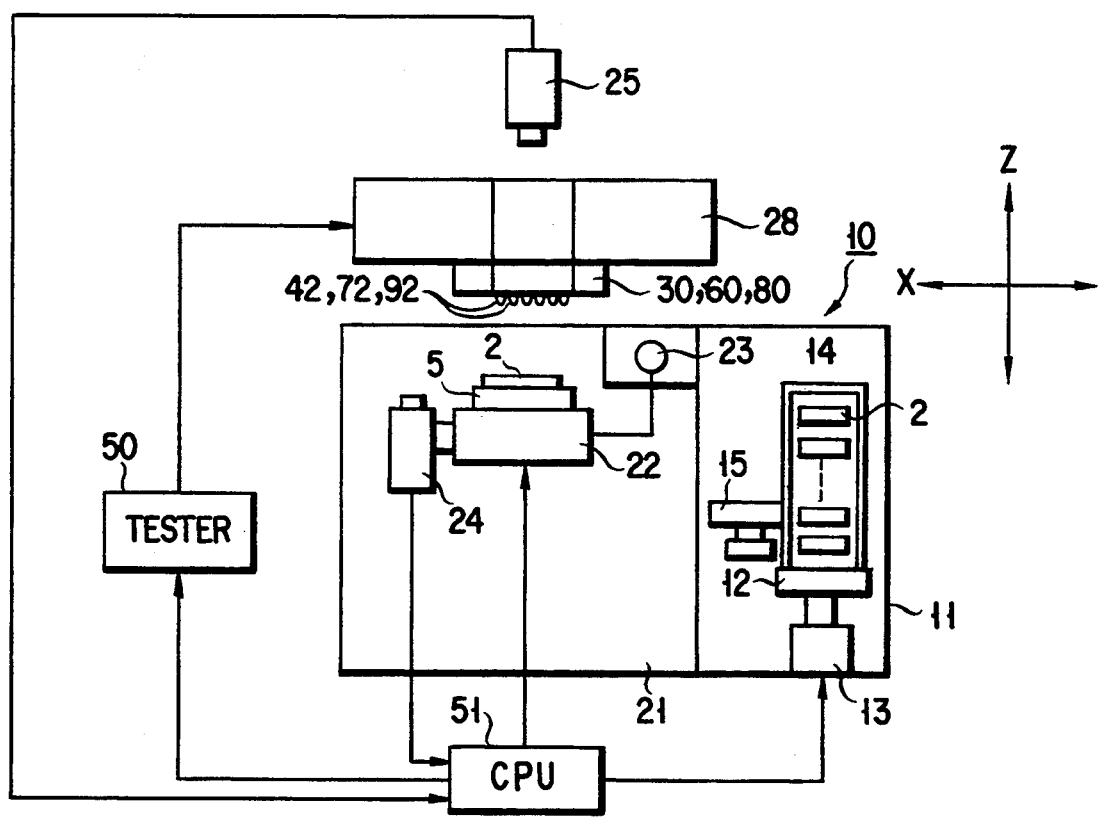
FIG. 4 is a block diagram showing a general configuration of a prober.

As shown in FIG. 4, a prober 10 comprises a loading/unloading section 11 and a test section 21. A test head 28 and an upper CCD camera 25 are arranged over the test section 21. The test head 28 is connected to a tester 50, which is backed up by a CPU 51. A probe card 30 is removably mounted on the lower surface of the test head 28 by means of a holder 29. The probe card 30 faces a wafer 2 on a test stage 22.

The loading/unloading section 11 is provided with a cassette stage 12 and a pre-alignment stage 15. The cassette stage 12 is supported on a lift mechanism 13, which is controlled by means of the CPU 51. A wafer cassette 14 is put on the stage 12. The cassette 14 contains 25 semiconductor wafers 2. The loading/unloading section 11 is provided with a transportation arm (not shown). The wafers 2 are taken out one after another from the cassette 14, transported, and put on the pre-alignment stage 15 by means of this arm.

The test section 21 is provided with a transfer device (not shown). Each semiconductor wafer 2 is transferred from the pre-alignment stage 15 to the test stage 22 by means of the transfer device. The stage 22 includes a vacuum suction device (not shown) for retaining the wafer 2 on a wafer table 5. Also, the stage 22 contains therein an X-Y-Z-$\theta$ drive mechanism (not shown) for moving the wafer table 5 in the X, Y, Z, and $\theta$ directions. This drive mechanism is controlled by means of the CPU 51. A joy-stick 23 is connected to the stage 22. The joy-stick 23, which is operated by an operator, can control the movement of the stage 22 in micron order. Further, a lower CCD camera 24 is mounted on the test stage 22. The lower CCD camera 24 is used to observe the distal end of a reference contactor 42, among other contactors 42, of the probe card 30, and to detect the position of the card. The upper and lower CCD cameras 24 and 25 are connected to the input side of the CPU 51.

Figure 5:
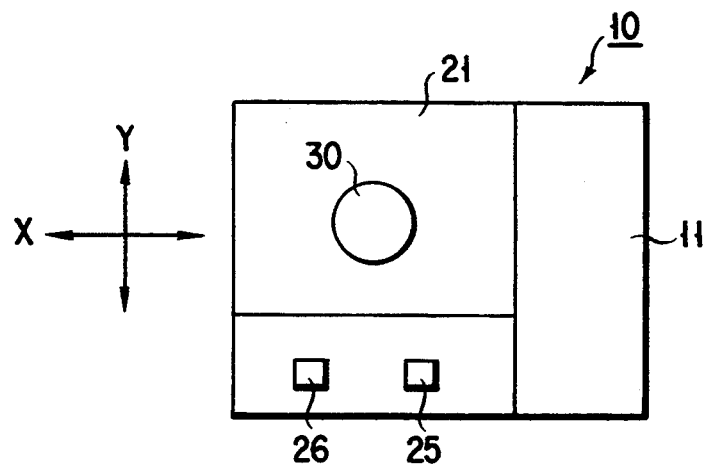
FIG. 5 is a schematic plan view showing a layout of the prober.

As shown in FIG. 5, the upper CCD camera 25 and a height sensor 26 are arranged in suitable positions on the test section 21. The camera 25 and the sensor 26 are used to accurately aligning the semiconductor wafer 2 on the test stage 22 in the X, Y, Z and $\theta$ directions.

The following is a description of the probe card 30 according to a first embodiment of the present invention.

Figure 7A:
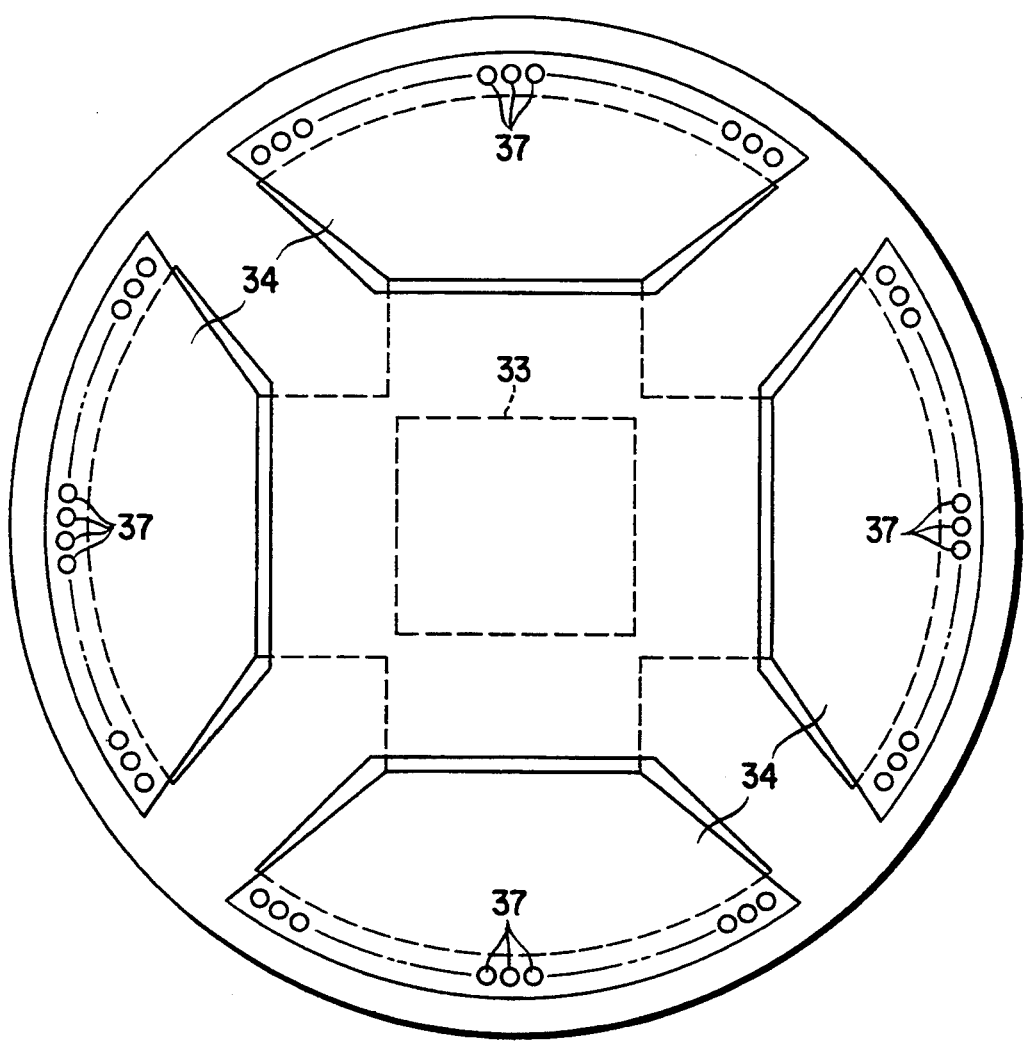
FIG. 7A is a top plan view of the probe card of the first embodiment.

AS shown in FIGS. 6 and 7A, the probe card 30 comprises a substrate 31 and a flexible printed circuit (FPC) 34 mounted thereon. The substrate 31, which is disk-shaped, has its peripheral edge portion supported on the holder 29. The substrate 31 is formed of a metal plate such as a stainless steel plate whose degree of deformation is small. The substrate 31 has a thickness of 5 to 10 mm and a diameter of 200 to 250 mm. Four openings are formed in the substrate 31, while the central portion of the FPC 34 is situated below the substrate 31, peripheral edge portions thereof penetrate the openings and are situated above the substrate 31.

The peripheral edge portions of the FPC 34 are bonded to the upper surface of the substrate 31 by means of insulating sheets 49. A number of terminals 37 are arranged at regular pitch intervals on each peripheral edge portion of the FPC 34. The terminals 37 are connected electrically to the contactors 42 in equally corresponding relation. Although the terminals 37 are arranged in a row on each peripheral edge portion of the FPC 34 in the illustrated case, they may alternatively be arranged in two or three rows.

The distal end of a pogo pin 98 is in contact with each terminal 37. Each pin 98 is held in one of recesses in a frame 28a of the test head 28, and is urged by a compression spring 99. Also, the pins 98 are connected electrically to the tester 50 through the test head 28.

An insulating member 32 is bonded to the center of the lower surface of the substrate 31. Further, the FPC 34 is bonded to the lower surface of the member 32. The insulating member 32 insulates the substrate 31 from the FPC 34. A number of contactors 42 are arranged so as to project from the central lower surface of the FPC 34. An elastic member 33, which is embedded in the central region of the insulating member 32, backs up the section in which the contactors 42 are mounted. Silicone rubber or polyurethane is used for the elastic member 33.

Figure 7B:
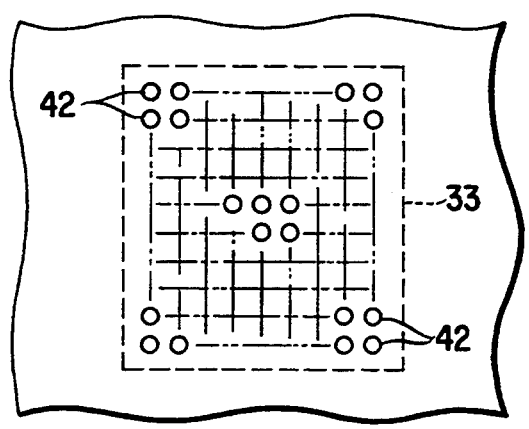
FIG. 7B is a partial bottom plan view showing the central portion (attached contactor portion) of the probe card of the first embodiment.

As shown in FIG. 7B, the contactors 42 are arranged in the form of a regular lattice. These contactors 42 equal pads 4 on a semiconductor chip 3 in number and in arrangement. More specifically, as is shown in FIG. 8, the contactors 42 are contact pins having a diameter of about 10 μm and assume a one-to-one relation with the pads 4. The number of contactors 42 may be increased to the maximum number (e.g., 500) of the terminals of the tester 50. The contactors 42 are electrically connected to the terminal 37 by wiring pattern formed on the FPC 34.

Referring further to FIGS. 8 to 11, the FPC 34 and the contact substrate 38 will be described in detail.

As shown in FIG. 8 one side (upper surface) of the FPC 34 adheres to the elastic member 33.

Figure 9:
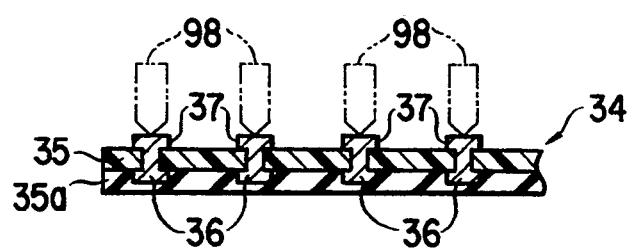
FIG. 9 is a vertical sectional view of an FPC (flexible printed circuit)
Figure 10:
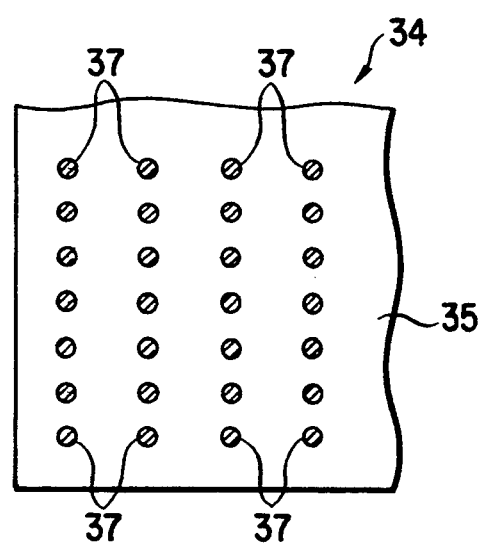
FIG. 10 is a top pattern (contact to po.go pins) view of the FPC.
Figure 11:
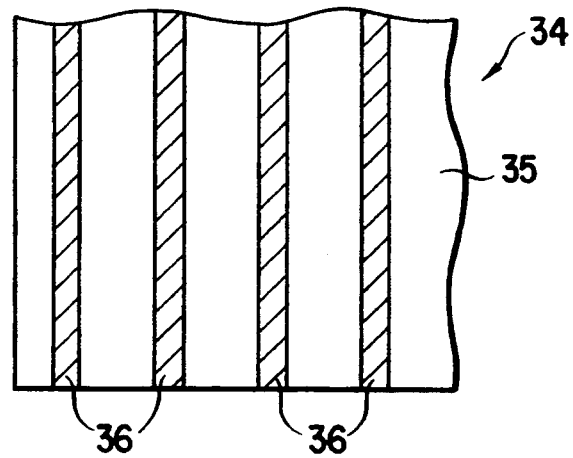
FIG. 11 is a bottom pattern view of the FPC.

As shown in FIG. 9, a substrate 35 of the FPC 34 is formed of a polyimide resin film. As shown in FIG. 10, a number of patterned terminals 37 are formed on one side (upper surface) of the substrate 35. The pogo pins 98 are in contact with terminals 37, respectively. As shown in FIG. 11, a printed circuit 36 is formed on the other side (lower surface) of the substrate 35.

Figure 12:
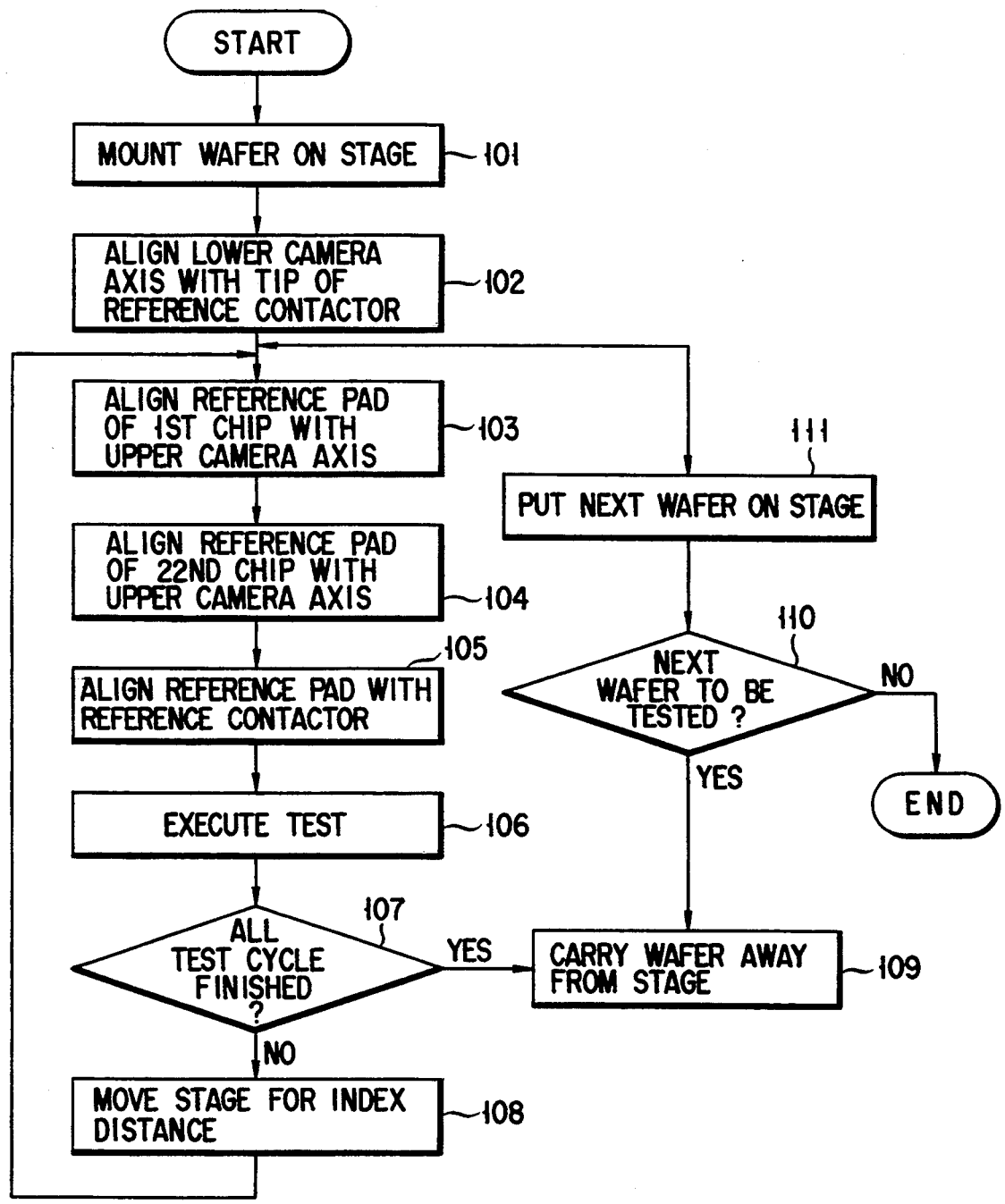
FIG. 12 is a flow chart showing processes of execution of a probing test.

Referring now to FIGS. 12 to 14, a probing test conducted on a semiconductor chip circuit by means of the aforementioned prober will be described.

First, one semiconductor wafer 2 is taken out of the cassette 14, and is put on the pre-alignment stage 15 to be pre-aligned. As shown in FIG. 13, a number of chips 3 are formed on the wafer 2. In the pre-alignment, process, an orientation flat 2a of the wafer 2 is oriented in a desired direction. After the pre-alignment, the wafer 2 is transported to be put on the wafer table 5 (Step 101). As a result, wafer 2 faces the probe card 30.

The probing test is conducted in four cycles for each wafer 2. More specifically, the upper left, upper right, lower left, and lower right regions (as in FIG. 13) of the wafer 2 are successively tested in the order named: Sixty-four semiconductor chips 3 are formed on each region. A pad situated in the upper left-hand corner, among pads formed on top left chips 3a, 3b, 3c and 3d of the individual regions, is selected as a reference pad 4a.

The stage 22 is moved within the XY-plane so that the optical axis of the lower CCD camera 24 is aligned with the distal end of the reference contactor 42 (Step 102). The position of the distal end of the reference contactor 42 is stored in the CPU 51 (teaching). In this case, the reference contactor 42 is situated in the upper left-hand corner of the array shown in FIG. 7B.

The test stage 22 is moved within the XY-plane so that the reference pad 4 of the first chip 3a is aligned with the optical axis of the upper CCD camera 25 (Step 103). Then, the stage 22 is moved within the XY-plane so that the reference pad of a 22nd chip 3 is aligned with the optical axis of the upper CCD camera 25 (Step 104). If the wafer 2 is in misalignment with the probe card 30 after these two aligning operations, the stage 22 is rotated in the 8 direction within the XY-plane, thereby correcting the position of the wafer 2 with respect to the card 30.

The reference pad 4 of the first chip 3a is aligned with the reference contactor 42 (Step 105). In this case, the joy-stick 23 may be used to make fine adjustments for the alignment. After the alignment, the test stage 22 is raised to bring the individual pads 42 into contact with their corresponding contactors 42. The ascending stroke of the stage 22 overdrives a simple contact position (in which the pads and contactors are simply in contact with one another). Since the elastic member 33 is elastically deformable, the contact between the pads 4 and the contactors 42 can be secured throughout the test regions.

Test signals are transmitted from the tester 50 to the individual contactors 42, and the 64 semiconductor chips 3 are subjected to the probing test (Step 106). It is determined whether all the test cycles for the wafer 2 are finished or not (Step 107). If the decision in Step 107 is NO, the test stage 22 is moved for an index distance, whereby the probe card 30 is opposed to the upper right region of the wafer 2 (Step 108). The processes of operation from Step 103 to Step 107 are repeated to test the chips 3 in the upper right region of the wafer 2. Then, the same operation is repeated twice to test the chips 3 in the lower left and lower right regions of the wafer 2.

If the decision in Step 107 is YES, the wafer 2 is carried away from the test stage 22 (Step 109), and it is determined whether the next wafer 2 should be tested or not (Step 110). If the decision in Step 110 is YES, the new wafer 2 is placed on the wafer table 5 (Step 111). Then, the processes of Steps 103 to 108 are repeated. If the decision in Step 110 is NO, the test is finished.

The probe card 30, which is the first embodiment of the invention, can be used to test a wafer 2 having as many LSI chips as 256 pieces formed on it, within a period 256 seconds shorter than is possible with the conventional prove card.

Despite the many contact points between pads 4 and the contactors 42, moreover, all the contactors 42 can fit their corresponding pads 4, so that the test signals can be securely transmitted to the LSI circuit, and LSI signals can be transmitted to the tester 50. Even if there are differences in level between the pads 4, in 10 particular, the contactors 42 are sure to fit the pads 4, since the elastic member 33 and the elastomer sheet 41 are deformable.

Since the contactors 42 have a low conduction resistance, they have a large current capacity. Hence, they ensure a reliable contact despite their small electrode area. In addition, since the contactors 42 are connected the terminal 37 by the low-impedance coaxial pattern circuit, the probe card can be used for high-frequency (100 MHz or more) tests.

Since the glass base 39 serves to maintain the flatness of the contactor-pad contact region, furthermore, the contact between the contactors and the pads can be stabilized. Thus, no additional test is required to check for contact failure, so that the throughput of the LSI production is improved.

The following is a description of a probe and according to a second embodiment of the present invention. As shown in FIG. 15, the contact substrate 38 includes a glass base 39 and an elastomer sheet 41. The base 39 is used to maintain the flatness of the contact substrate 38. The sheet 41 helps the contactors 42a follow the pads 4. Silicone rubber is used as the material of the sheet 41. Alternatively, the elastomer sheet 41 may be formed of a flexible material such as fluoroplastics or polyethylene.

The silicone rubber sheet 41 is provided on one side (lower surface) of the glass base 39. Each contactor 42a is formed by embedding globules 43 in a protuberance protruding downward from the sheet 41. The respective silicone rubber protuberances of the contactors 42a have their projection length ranging from 80 to 100 $\mu$m, base diameter from 50 to 60 $\mu$m, and pitch intervals from 90 to 110 $\mu$m. Each semiconductor chip 3 is formed having 400 bump pads 4. The contact surface of each pad 4 is in the form of a square whose sides have a length of 60 to 100 $\mu$m each.

The globules 43 are arranged in a row in each silicone rubber protuberance. Each globule 43 is formed by gilding a nickel sphere with a diameter of 25 to 30 $\mu$m. The top globule 43 is in contact with one of terminals 44 on the glass base 39. The bottom globule 43 is embedded in the distal end portion of the protuberance. If each contactor 42a is pressed against its corresponding pad 4, the distal end of the rubber protuberance is broken, thereby causing the globules 43 to be exposed, so that the globules 43 are brought into electrical contact with the pad 4. If the contactor 42a is disengaged from the pad 4, on the other hand, the distal end of the protuberance is closed to conceal the globules 43 therein, so that the globules 43 are prevented from dropping out of the rubber protuberance. The globules 43 can thus repeat the exposure and concealment because the silicone rubber is gel.

The following is a description of a method for manufacturing the contactors 42a. A necessary number of globules 43 are put in a recess of a mold, a liquid silicone rubber material is poured into the mold, and the mold is placed in a magnetic field. Thereupon, the globules 43 in the recess are arranged in a straight line by magnetic force. The silicone rubber sheet 41 having a number of contactors 42a can be obtained by solidifying the silicone rubber. The sheet 41 is bonded to the one side of the glass base 39 by means of an adhesive agent.

A number of terminals 44 are formed on the one side (lower surface) of the glass base 39, and a conductor pattern circuit 40 on the other side (upper surface). The circuit 40 has a coaxial pattern to provide low impedance. The terminals 44 and the conductor pattern circuit 40 are obtained by putting copper leaf over the glass base 39. As shown in FIG. 15m a printed circuit 36a of FPC 34a is connected electrically to the conductor pattern circuit 40 of the glass base 39. The pogo pins 98 are contact with terminals 37a, respectively. The terminals 37a are connected electrically to the printed circuit 36a.

The following is a description of a probe card 60 according to a third embodiment of the present invention.

Figure 16:
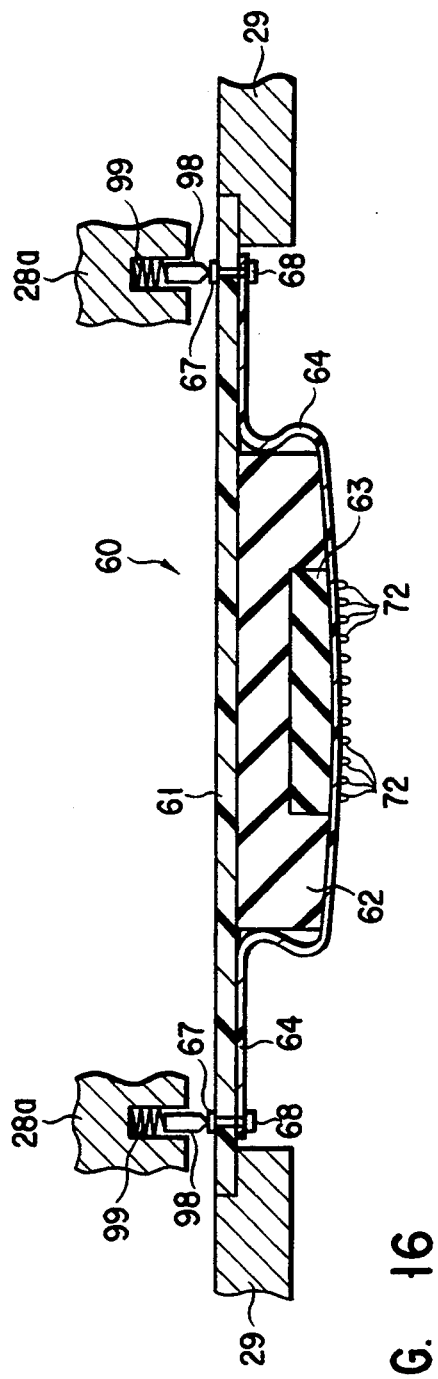
FIG. 16 is a vertical sectional view showing a probe card according to a third embodiment of the invention.

As shown in FIGS. 16 and 17A, the probe card 60 comprises a substrate 61 and an FPC 64 mounted thereon. The substrate 61, which is disk-shaped, has its peripheral portion supported on the holder 29. The substrate 61 is formed of a polyimide resin plate with a thickness of 4.2 mm and a diameter of 20 mm.

The peripheral portions of the FPC 64, which are bonded to the lower surface of the substrate 61, are fixed to the substrate 61 by means of pins 68. A number of terminals 67 are arranged at regular pitch intervals on each peripheral portion of the FPC 64. The terminals 67 and a printed circuit 66 are connected electrically by means of the pins 68. The terminals 67 are connected electrically to the contactors 72 in equally corresponding relation. Although the terminals 67 are arranged in a row on each peripheral portion of the FPC 64 in the illustrated case, they may alternatively be arranged in two or three rows.

The distal end of a pogo pin 98 is in contact with terminal 67, respectively. Each pin 98 is held in recesses in a frame 28a of the test head 28, and is urged by a compression spring 99. Also, the pins 98 are connected electrically to the tester 50 through the test head 28.

An insulating member 62 is bonded to the center of the lower surface of the substrate 61. Further, a FPC 64 is bonded to the lower surface of the member 62. A number of contactors 72 are arranged so as to project from the lower surface of the FPC 64. An elastic member 63, which is embedded in the central region of the insulating member 62, backs up the section in which the contactors 72 are mounted. Silicone rubber or polyurethane is used for the elastic member 62.

As shown in FIG. 17B, the contactors 72 are arranged in the form of a regular lattice. These contactors 72 equal the pads 4 on the semiconductor chip 3 in number and in arrangement. Thus, the contactors 72 correspond to the pads 4 in equal relation.

Figure 18:
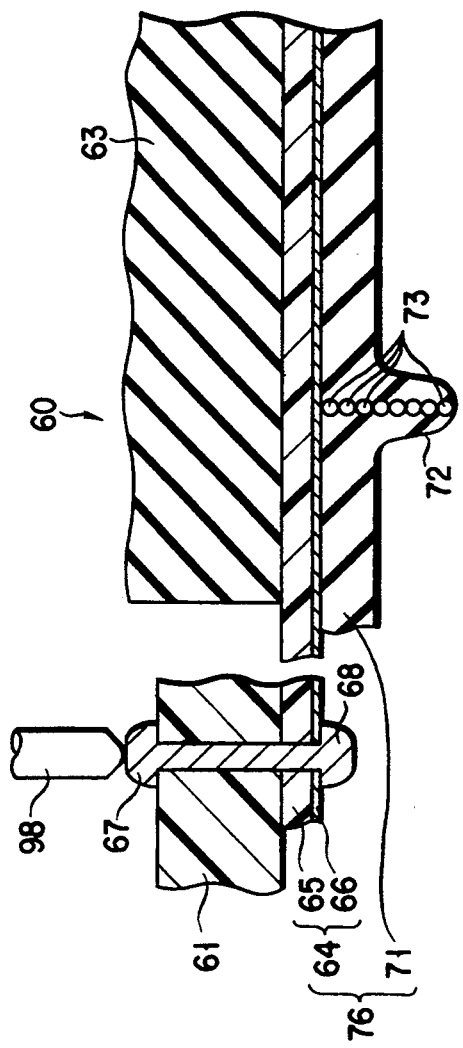
FIG. 18 is an enlarged vertical sectional view showing attached contactor portion of the probe card of the third embodiment.

Referring further to FIGS. 18, a contact substrate 76 having the FPC 64 will be described in detail.

The contact substrate 76 is formed by bonding an elastomer sheet 71 to the FPC 64. The FPC 63 is substantially identical with the FPC 34 shown in FIGS. 9 to 11. The sheet 71 helps the contactors 72 follow the pads 4. Silicone rubber is used as the material of the sheet 71. Alternatively, the elastomer sheet 71 may be formed of a flexible material such as fluoroplastics or polyethylene.

The silicone rubber sheet 71 is provided on one side (lower surface) of the FPC 64. Each contactor 72 is formed by embedding globules 73 in a protuberance protruding downward from the sheet 71. The respective silicone rubber protuberances of the contactors 72 have their projection length ranging from 80 to 100 μm, base diameter from 50 to 60 μm, and pitch intervals from 90 to 110 μm.

The globules 73 are arranged in a row in each silicone rubber protuberance. Each globule 73 is formed by gilding a nickel sphere with a diameter of 25 to 30 μm. The top globule 73 is in contact with the printed circuit 66 of the FPC 64. The bottom globule 73 is embedded in the distal end portion of the protuberance. If each contactor 72 is pressed against its corresponding pad 4, the distal end of the rubber protuberance is broken, thereby causing the globules 73 to be exposed, so that the globules 73 are brought into electrical contact with the pad 4. If the contactor 72 is disengaged from the pad 4, on the other hand, the distal end of the protuberance is closed to conceal the globules 73 therein, so that the globules 73 are prevented from dropping out of the rubber protuberance. The globules 73 can thus repeat the exposure and concealment because the silicone rubber is gel.

The probe card 60, which is the third embodiment of the invention, can be used to test a wafer 2 having as many LSI chips as 256 pieces formed on it, within a period 256 seconds shorter than is possible with the conventional prove card, assuming that the index time is 1 sec/chip. Even if there are differences in level between the pads 4, moreover, the contactors 72 are sure to fit the pads 4, since the elastic member 63 and the elastomer sheet 71 are deformable. Thus, a reliable test can be conducted on the LSI chips B despite the high density of the pads 4 thereon.

Figure 19:
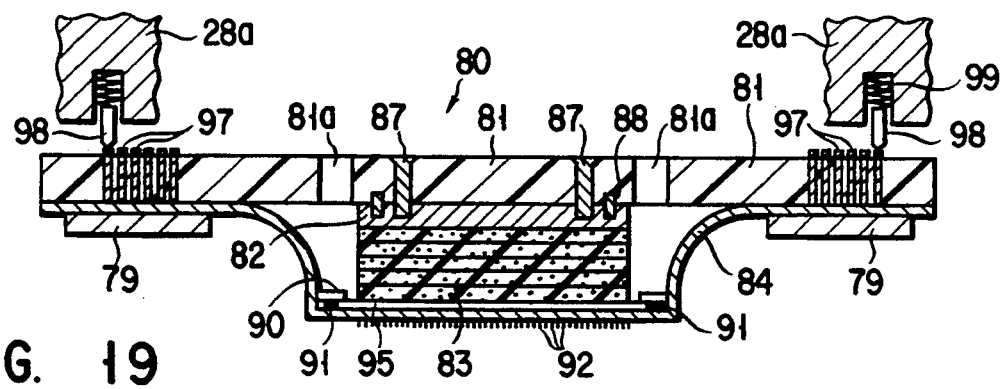
FIG. 19 is a vertical sectional view showing a probe card according to a fourth embodiment of the invention.
Figure 20:
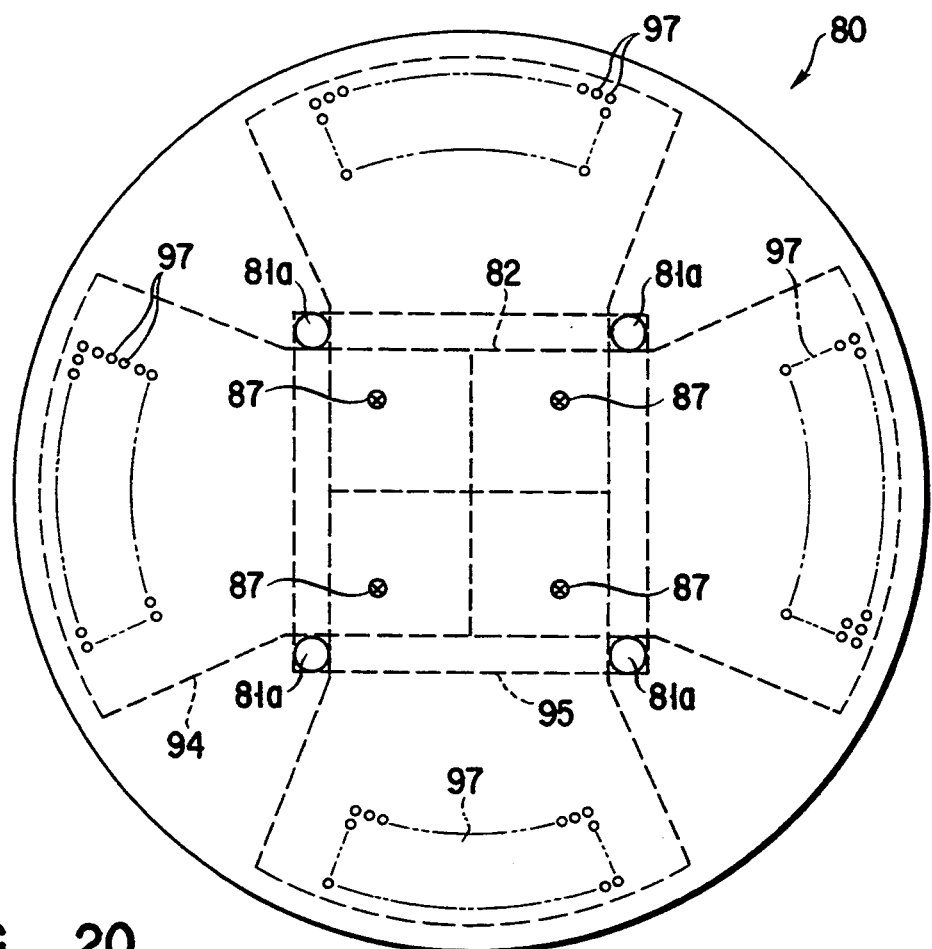
FIG. 20 is a top plan view of attached contactor portion of the probe card of the fourth embodiment.
Figure 21:
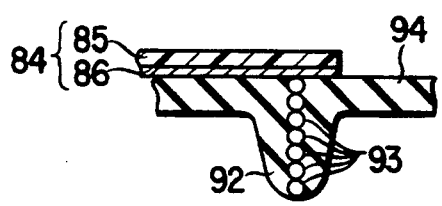
FIG. 21 is an enlarged vertical sectional view showing part of the probe card of the fourth embodiment.

Referring now to FIGS. 19 to 21, a fourth embodiment of the present invention will be described. A probe card 80 according to this fourth embodiment is used to subject liquid crystal display bases (LCD bases) to a probing test. In connection with this embodiment, the way of simultaneously testing four LCD bases will be described.

As shown in FIGS. 19 and 20, the probe card 80 comprises a main substrate 81, a flexible substrate 84, a transparent plate 95, and an elastic member 83. The insulating substrate 81 is formed of a material, such as polyimide, which has high heat resistance and dimensional stability. When the probe card 80 is set in a holder (not shown), pogo pins 98 abut against their corresponding terminal pads 97, so that contactors 92 of the card 80 are connected electrically to the tester 50.

The flexible substrate 84 is based on a flexible insulating film material, such as silicone rubber, and the electrically conductive contactors 92 are provided on one side of the substrate 84. The contactors 92 are arranged equally corresponding to pads of the LCD bases. Also, the contactors 92 are as many as the terminal pads 97. The number of the contactors 92 may be increased so as to be equal to the maximum number (e.g., 500) of the terminals of the tester 50.

As shown in FIG. 21, each contactor 92 is formed by arranging metal globules at least in a row in the direction of the thickness of a silicone rubber sheet 94. According to these contactors 92, a large current capacity can be obtained with use of a low conduction resistance, and only a fine electrode area can ensure a reliable contact. The top globule 93 is in contact with a conductor pattern 86 of the flexible substrate 84. The bottom globule 93 is designed so as to be in contact with one of the pads of the LCD base.

The transparent plate 95, which is a member for fixing the flexible substrate 84, is formed of a glass plate or the like. The plate 95 is fixed to one side (upper surface) of the flexible substrate 84 by means of a fixing member 90. The transparent plate 95 is used to maintain the flatness of the flexible substrate 84. Alignment marks 91 are put on the upper surface of the plate 95.

The elastic member 83, which is formed of five sheets of polyurethane, is sandwiched between an insulating substrate 82 and the flexible substrate 84. The insulating substrate 82 is mounted on the lower surface of the main substrate 81 by means of four screws 87. The substrates 82 and 81 can be accurately assembled by means of positioning pins 88. The insulating substrate 82 is formed of a material with high dimensional stability, and its surface is finished with high flatness.

The peripheral edge portion of the flexible substrate 84 is fixed to the main substrate 81 by means of a ring-shaped fixing member 79. Thus, the conductor pattern 86 of the substrate 84 is connected electrically to the terminal pads 97.

As shown in FIGS. 19 and 20, four apertures 81a are formed in suitable portions of the main substrate 81. The alignment marks 91 can be recognized through the apertures 81a by means of the upper CCD camera 25, whereby the pads of the LCD bases and the contactors 92 can be aligned with one another.

The following is a description of the operation of the fourth embodiment.

The LCD bases are transported from a cassette of a sender of an LCD base tester, and are put on the test stage. In order to test four LCD bases at a time, in this case, the LCD bases are fed one after another onto the test stage. The test stage is horizontally moved with reference to the alignment marks 91 observed through the apertures 81a of the probe card 80. Then, the test stage is raised to bring the pads of the LCD bases into contact with their corresponding contactors 92. At this time, the contactors 92 come securely into contact with the pads of the LCD bases, following the indentations of the pads. If the probe card 80 is tilted with respect to a horizontal plane, on account of its inaccurate attachment, the tilt can be corrected by a deformation of the elastic member 83. Thus, all the contactors 92 can be brought securely into contact with their corresponding pads of the LCD bases. The contactors 92 are alternatively operated by means of the tester, to apply voltage signals (test signals) to the pads of the LCD base. The tested LCD bases are transported to a receiver, whereupon the test is finished.

According to the fourth embodiment described above, the main substrate 81 of the probe card 80 is situated right over the LCD bases during the test, so that there is no possibility of dust or particles falling on the LCD bases, that is, the LCD bases can be kept clean.

According to the fourth embodiment, moreover, it is necessary only that the LCD bases be aligned once with the probe card 80, and the whole surface of one LCD base or a plurality of LCD bases can be tested after this first alignment only.

Since the flexible substrate 84 is mounted on the main substrate 81 by means of the fixing member 79, furthermore, the whole probe card 80 need not be replaced with a new one in case the contactors 92 are damaged or worn away. In such a case, it is necessary only that an integral assembly ranging from the flexible substrate 84 to the main substrate 81 be replaced. Even when the probe card is replaced, moreover, the flexible substrate 84 never fails to be accurately mounted by means of the positioning pins 88.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A probe card used in a probing test machine which sends and receives test signals into circuits through pads of an object of testing, thereby examining the electrical characteristics of the circuits, comprising:
   a supporting plate;
   a circuit base supported by the supporting plate and including printed circuits connected electrically to test signal supply means;
   contactors connected electrically to the printed circuits of the circuit base and adapted to be brought into contact with the pads of the object of testing in equally corresponding relation;
   an insulating member supported by the supporting plate;
   an elastic member embedded in the insulating member and for backing up a section of the circuit base on which the contactors are vertically mounted, the elastic member being held firmly in the insulating member; and
   wherein the elastic member is elastically deformed when the contractors are pushed to the pads so as to cause the contactors within the section to be displaced in a vertical direction.

2. A probe card according to claim 1, wherein said circuit base is penetrated by an electrically conductive pin, and the circuit on one side of the circuit base and the circuit on the other side are connected electrically to each other by means of the conductive pin.

3. A probe card according to claim 1, wherein said supporting plate is penetrated by a through hole through which the pads or alignment marks can be observed.

4. A probe card according to claim 1, wherein said contactors are arranged over a central portion of a region to be tested as well as over the peripheral portion thereof.

5. A probe card according to claim 1, wherein said object of testing is a substrate used for liquid crystal display.

6. A probe card according to claim 1, wherein said object of testing is a semiconductor wafer.

7. A probe card used in a probing test machine which sends and receives test signals into circuits through pads of an object of testing, thereby examining the electrical characteristics of the circuits, comprising:
   a supporting plate;
   a flexible printed circuit base including a flexible film base material supported by the supporting plate, circuits printed on the film base material being connected electrically to test signal supply means;
   contactors connected electrically to the circuits of the printed circuit base and adapted to be brought into contact with the pads of the object of testing in equally corresponding relation;
   an insulating member supported by the supporting plate;
   an elastic member embedded in the insulating member and for backing up a section of the circuit base on which the contactors are vertically mounted, the elastic member being held firmly in the insulating member; and
   wherein the elastic member is elastically deformed when the contractors are pushed to pads so as to cause the contactors within the section to be displaced in a vertical direction.

8. A probe card according to claim 6, wherein said flexible printed circuit base is penetrated by an electrically conductive pin, and the circuit on one side of the circuit base and the circuit on the other side are connected electrically to each other by means of the conductive pin.

9. A probe card according to claim 6, wherein said supporting plate is penetrated by a through hole through which the pads or alignment marks are observed.

10. A probe card according to claim 6, wherein said contactors are arranged over a central portion of a region to be tested as well as over the peripheral portion thereof.

11. A probe card according to claim 7, wherein said object of testing is a substrate used for liquid crystal display.

12. A probe card according to claim 7, wherein said object of testing is a semiconductor wafer.

* * * * *